US012324112B2

(12) United States Patent
Buchanan et al.

(10) Patent No.: US 12,324,112 B2
(45) Date of Patent: Jun. 3, 2025

(54) SHROUD ASSEMBLY

(71) Applicant: Pacific Technical Solutions, Inc., Allen, TX (US)

(72) Inventors: Brock Thomas Buchanan, Dallas, TX (US); Jerry Douglas Leopold, Sachse, TX (US); Mark W. Zamalloa, Allen, TX (US)

(73) Assignee: Pacific Technical Solutions, Inc., Allen, TX (US)

( * ) Notice: Subject to any disclaimer, the term of this patent is extended or adjusted under 35 U.S.C. 154(b) by 0 days.

(21) Appl. No.: 18/443,127

(22) Filed: Feb. 15, 2024

(65) Prior Publication Data

US 2024/0284616 A1    Aug. 22, 2024

Related U.S. Application Data

(60) Provisional application No. 63/485,456, filed on Feb. 16, 2023.

(51) Int. Cl.
  *H01Q 1/42*     (2006.01)
  *H05K 5/02*     (2006.01)

(52) U.S. Cl.
  CPC ............ *H05K 5/0217* (2013.01); *H01Q 1/42* (2013.01)

(58) Field of Classification Search
  CPC ................................. H01Q 1/42; H01Q 1/428
  See application file for complete search history.

(56) References Cited

U.S. PATENT DOCUMENTS

| | | | |
|---|---|---|---|
| 10,840,590 B1* | 11/2020 | Wolf ........................ | H01Q 1/42 |
| 2011/0248894 A1* | 10/2011 | Crowley .................. | H01Q 1/08 343/702 |
| 2016/0211574 A1* | 7/2016 | Dundorf .................. | H01Q 1/44 |
| 2017/0352939 A1* | 12/2017 | Ohlsson ............... | H01Q 1/1228 |
| 2018/0351248 A1* | 12/2018 | Kim ........................ | H01Q 1/08 |
| 2020/0119426 A1* | 4/2020 | Peng .................... | H01Q 1/1228 |
| 2022/0149503 A1* | 5/2022 | Petrosyan ............ | H01Q 1/1242 |
| 2022/0231400 A1* | 7/2022 | Kim ..................... | H04B 17/309 |

* cited by examiner

*Primary Examiner* — Hung V Ngo
(74) *Attorney, Agent, or Firm* — Foster Garvey P.C.

(57) ABSTRACT

A shroud assembly is disclosed. The shroud assembly may include a shroud configured to enclose equipment. The shroud assembly may further include a support structure configured to provide support to the shroud. The shroud assembly may additionally include one or more alignment channels disposed at a periphery of the support structure. Furthermore, the shroud assembly may include a slide block configured to slide vertically inside the alignment channels. The slide block may be further configured to engage with the shroud, and move the shroud vertically between a first position and a second position.

20 Claims, 6 Drawing Sheets

SHROUD ASSEMBLY

PRIORITY CLAIM

The present application claims the benefit of U.S. Provisional Patent Application Ser. No. 63/485,456 filed Feb. 16, 2023 and is incorporated by reference in its entirety as if fully set forth herein.

TECHNICAL FIELD

The present disclosure relates to a shroud assembly, and more particularly, to a shroud assembly for cellular infrastructure.

BACKGROUND

With the advances in cellular technology, the need to service and maintain the infrastructure becomes even more critical to provide the ambiguous wireless service that is such a vital part of everyday life in the modern world.

The backbone of that cellular infrastructure is the system of towers that provide cellular coverage around the world. Maintaining that system of towers involves not only software, but servicing and maintaining the hardware and physical structure.

However, with the ever-growing need for densification of the current wireless networks, more cellular towers will be required along with their corresponding maintenance. Many jurisdictions further require the concealment from view of the radios now at the top of the tower and antenna systems, in order to provide better visual aesthetics.

One such method of concealment is the use of a shroud. Shrouds cover and conceal the equipment, but that comes at a cost: access to the underlying equipment becomes difficult and expensive.

There exist various approaches to access the equipment including making panels of the shroud removable, hinge open, accordion open, rotate, having the entire shroud removed via a crane.

Each of these approaches create other problems for maintenance or limit the shroud's underlying efficacy. For example, cellular towers are often exposed to high wind and the large size of these shroud panels can be difficult to maneuver high above the ground. Panels that are removed or swing open could be very difficult to control in high winds and create a dangerous situation for the maintenance workers. It is often not feasible to simply delay maintenance until calmer conditions because of the time sensitive nature of many repairs. In bad weather or wind conditions, panels or doors could be dropped or damaged during maintenance.

Another challenge with these large panels or shrouds is what to do with them when removed during maintenance. Often, they can deform and make it difficult to re-install.

Cranes are costly and likewise not an ideal solution because not all locations are easily accessed by a crane and high winds also pose a hazard to crane operations. Further, in crowded urban environments, bringing in a crane could also require traffic control or be otherwise difficult to maneuver a crane into position.

In light of the above, a system is needed that facilities users to handle a shroud and conveniently access the equipment during maintenance.

It is with respect to these and other considerations that the disclosure made herein is presented.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

DETAILED DESCRIPTION

Overview

The present disclosure describes a shroud assembly for wireless communication equipment (such as a cellular tower). The shroud assembly may include a shroud configured to enclose the equipment. The shroud assembly may further include a support structure configured to provide support to the shroud. The shroud assembly may further include one or more alignment channels disposed at a periphery of the support structure. The shroud assembly may further include a slide block configured to slide vertically inside the alignment channels. The slide block may be further configured to engage with the shroud, and move the shroud vertically between a first position and a second position.

In some aspects, the shroud assembly may further include a cable configured to engage the slide block with a counter weight. The cable may be disposed inside the alignment channels.

In some aspects, the shroud may include a protrusion, and the slide block may include a cavity. The protrusion may be configured to engage with the cavity to engage the shroud with the slide block. The shroud may be configured to enclose the support structure and the alignment channels.

The shroud may be a one-piece shroud, and may have a hollow body. The shroud assembly may further include a float plate configured to connect the alignment channels with the support structure. In some aspects, the support structure may include one or more circular plates.

The present disclosure discloses a system that enables a user to handle the shroud and access the equipment conveniently during maintenance. The present disclosure simplifies access to the pole top equipment and eliminates the need to fully remove the shroud to gain access for maintenance and servicing. The present disclosure uses one-piece shroud that is beneficial in high wind areas. The present disclosure has an aerodynamic shape that reduces drag, thus also reducing forces exerted on the shroud and reduces the structural requirements of the base and foundation of the pole structure. This also reduces overall cost. The present disclosure is also advantageous because it eliminates seams.

The elimination of seams presents less weak points in the shroud assembly where it could more easily become damaged or break.

The present disclosure may be used to provide access to certain internal equipment while keeping the shroud partially in place by having the shroud lifted, but not fully removed. Instead, the shroud is lifted enough to provide access to underlying equipment, and then is simply lowered back into place, maintaining the integrity of the shroud and done without the need of tools, heavy equipment, or specialized equipment. Specifically, the present disclosure enables the raising and lowering of the shroud by a single maintenance worker positioned in a man lift, without other heavy equipment. This in turn saves both time and money involved in servicing the equipment.

The present invention may also be implemented without the need for electric motors, gas springs, torsion springs, extension springs, linkages, or gearing. All of which would involve increased cost and additional points of failure that are not optimal for operation and maintenance. In addition, the present disclosure may be implemented through material that has minimal RF interference.

These and other advantages of the present disclosure are provided in detail herein.

Illustrative Embodiments

The disclosure will be described more fully hereinafter with reference to the accompanying drawings, in which example embodiments of the disclosure are shown, and not intended to be limiting.

Figure 1:
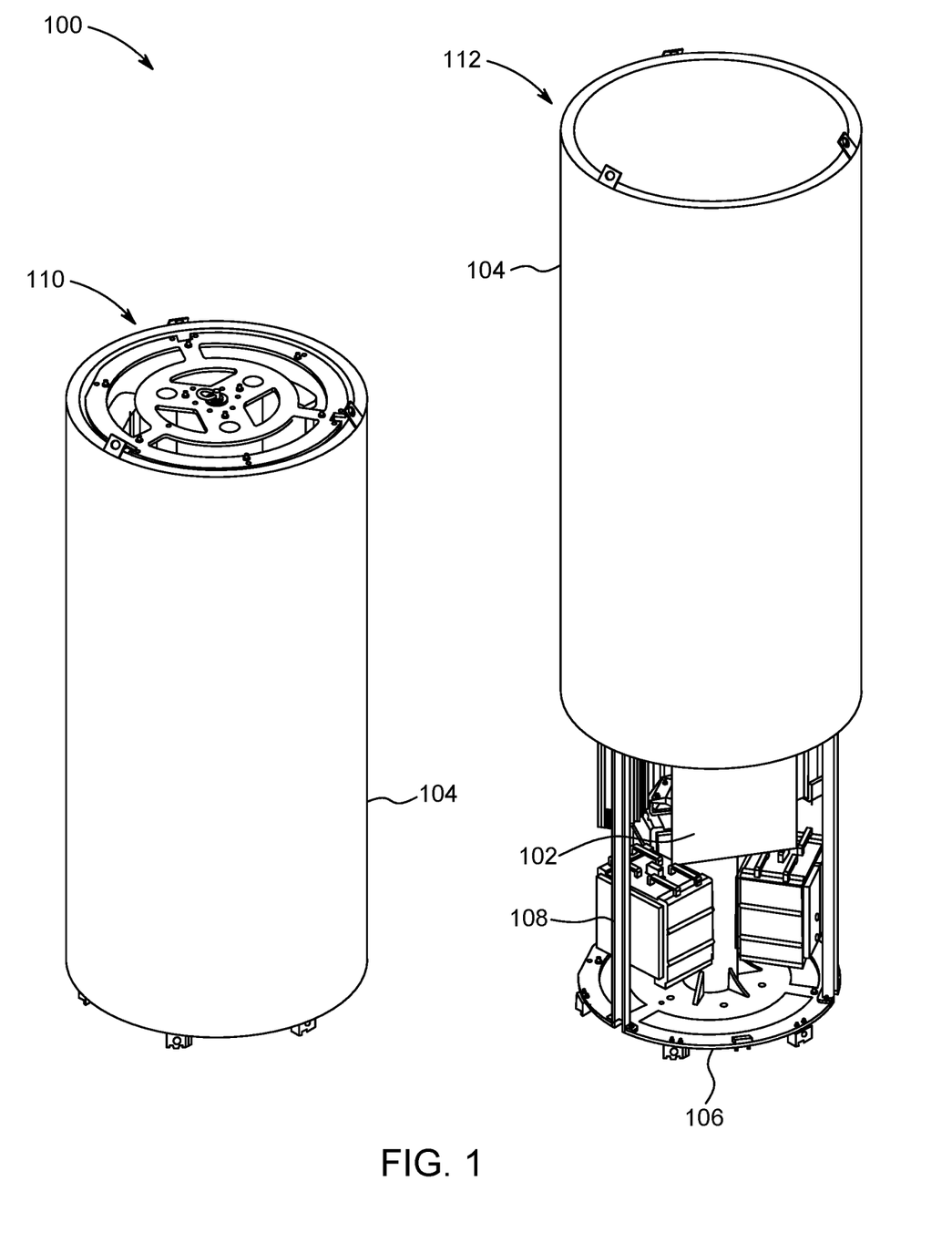
FIG. 1 depicts an example environment in which techniques and structures for providing the systems and methods disclosed herein may be implemented.

FIG. 1 depicts an example environment 100 in which techniques and structures for providing the systems and methods disclosed herein may be implemented.

The environment 100 includes a shroud assembly configured to enclose or cover an equipment 102. In some aspects, the shroud assembly may be configured to completely enclose the equipment 102. In an exemplary embodiment, the equipment 102 may be a cellular tower that is configured to provide cellular coverage. A person ordinarily skilled in the art may appreciate that cellular towers may be stand-alone structures, or may be equipment installed or placed on pre-existing structures, such as buildings, streetlights or collocating with other radio or antenna equipment for other services. A cellular tower may include a plurality of components including, but not limited to, antennas, transmitters, receivers, and/or the like.

In some aspects, the shroud assembly may include a shroud 104 that may completely enclose (as an example) the equipment 102. The shroud 104 may be of any size and any shape, which facilitates the shroud 104 to cover the equipment 102. For example, the shroud 104 may have a hollow cylindrical, or any other shape, body that may be configured to receive and surround the equipment 102. In some aspects, the ends (e.g., the top end and the bottom end) of the shroud 104 may be open. In further aspects, the length of the shroud 104 may be equivalent or slightly greater than the length of the equipment 102 (e.g., 20-30 inches). In addition, the shroud 104 may have any diameter, e.g., in a range of 30-42 inches. The shroud 104 may be made of any lightweight, ultraviolet (UV) resistant, and RF transparent material such as plastic, thermoplastic (eg, acrylonitrile butadiene styrene, thermoplastic polyolefin, acrylic polyvinyl chloride alloy), and vinyl foam core sandwich panels. In further aspects, the shroud 104 may be a one-piece shroud, and may not have any seam. In other aspects, the shroud 104 may include more than one piece/panel.

The shroud assembly may further include a support structure 106 and alignment channel(s) 108 that may be configured to provide support to the shroud 104. The shroud 104 may be configured to enclose the equipment 102 via the support structure 106 and the alignment channel(s) 108. The support structure 106 and the alignment channel(s) 108 may facilitate the shroud 104 to move/slide vertically over the alignment channel(s) 108 (e.g., between a first position (or a closed position) and a second position (or an open position)), without removing/detaching the shroud 104 completely.

In the first position, the shroud 104 may be configured to completely enclose the equipment 102 (and the support structure 106 and the alignment channel(s) 108), as shown in a view 110 of FIG. 1. In the second position, the shroud 104 may be configured to expose (e.g., partially expose) the equipment 102. A partial open position of the shroud 104 is shown in a view 112 of FIG. 1. A user may move the shroud 104 from the first position to the second position during maintenance/service. For example, the user may move the shroud 104 upwards to any height based on the user's requirement so that the user may perform the maintenance work easily, without completely removing the shroud 104.

Further details of the support structure 106 and the alignment channel(s) 108 may be understood in conjunction with FIGS. 2-5.

Figure 2:
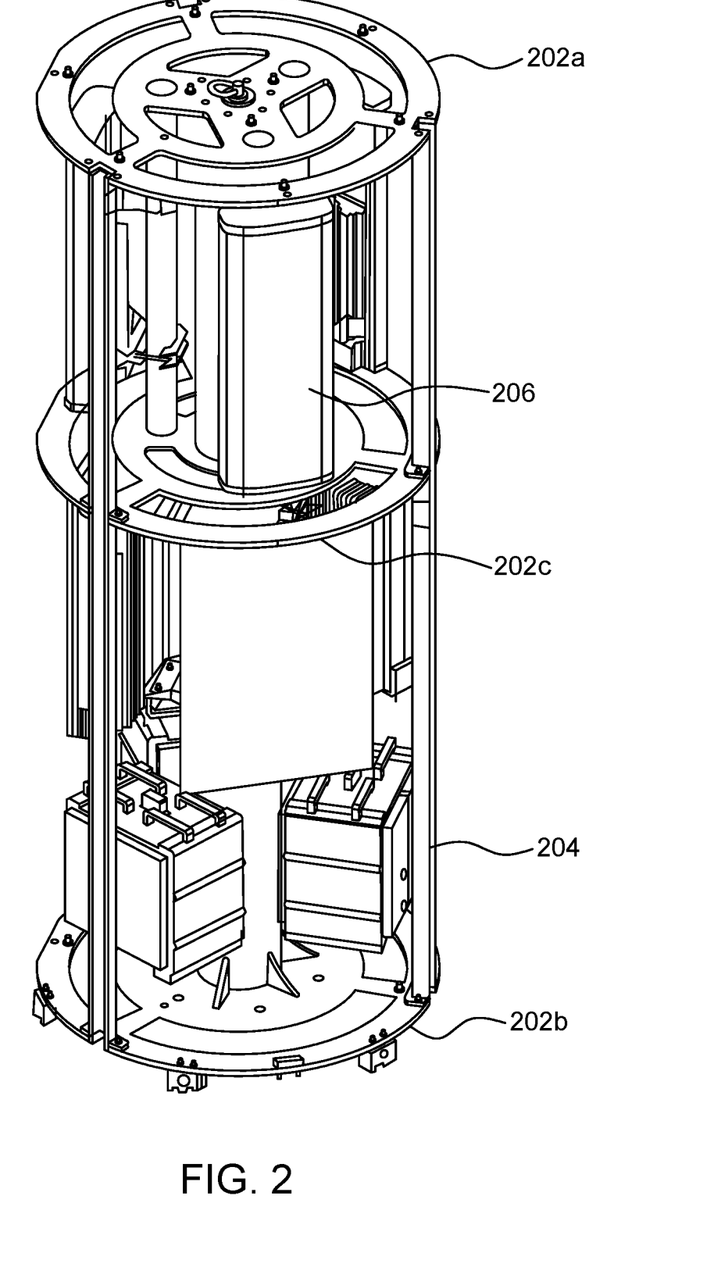
FIG. 2 depicts an example portion of a shroud assembly and equipment in accordance with the present disclosure.

FIG. 2 depicts an example portion of a shroud assembly and an equipment in accordance with the present disclosure. Specifically, FIG. 2 depicts one or more support structures 202a, 202b, 202c (collectively referred as support structure 202) and alignment channel(s) 204 of the shroud assembly, and the equipment 206 (without the shroud 104). The support structure 202 may be same as the support structure 106, the alignment channels 204 may be same as the alignment channels 108, and the equipment 206 may be same as the equipment 102, described above in conjunction with FIG. 1.

In some aspects, the support structure 202 may include one or more circular plates that may be configured to provide support to the equipment 206 and the shroud 104. The support structure 202 may be positioned at different positions. For example, the support structure 202a may be disposed in proximity to a top end of the equipment 206, the support structure 202b may be disposed in proximity to a bottom end of the equipment 206, and the support structure 202c may be disposed in proximity to a middle portion of the equipment 206 (e.g., between the top end and the bottom end of the equipment 206). In some aspects, the distance between the support structure 202c and the support structure 202a may be same as the distance between the support structure 202c and the support structure 202b. In other aspects, the distance between the support structure 202c and the support structure 202a may be different from the distance between the support structure 202c and the support structure 202b. For example, the support structure 202c may be disposed in proximity to or closer to the support structure 202a, relative to the support structure 202b.

In some aspects, the support structure 202a, 202b, and 202c may have same structure, dimensions and may be made of same material. For example, the support structure 202a, 202b, and 202c may have the same diameter. The diameter of the support structure 202 may correspond to the diameter of the shroud 104. For example, the diameter of the support structure 202 may be equivalent to or slightly less than the diameter of the shroud 104. In further aspects, each of the support structure 202a, 202b, and 202c may include a plurality of holes/openings to facilitate positioning of components of the equipment 206 (and may support such components). For example, the components may pass through the holes/openings, as shown in FIG. 2. The plurality of holes/openings may be present in a predetermined pattern. In some aspects, the pattern of the plurality of holes/openings may be different in different support structures, which may be based on the components of the equipment 206.

Figure 3:
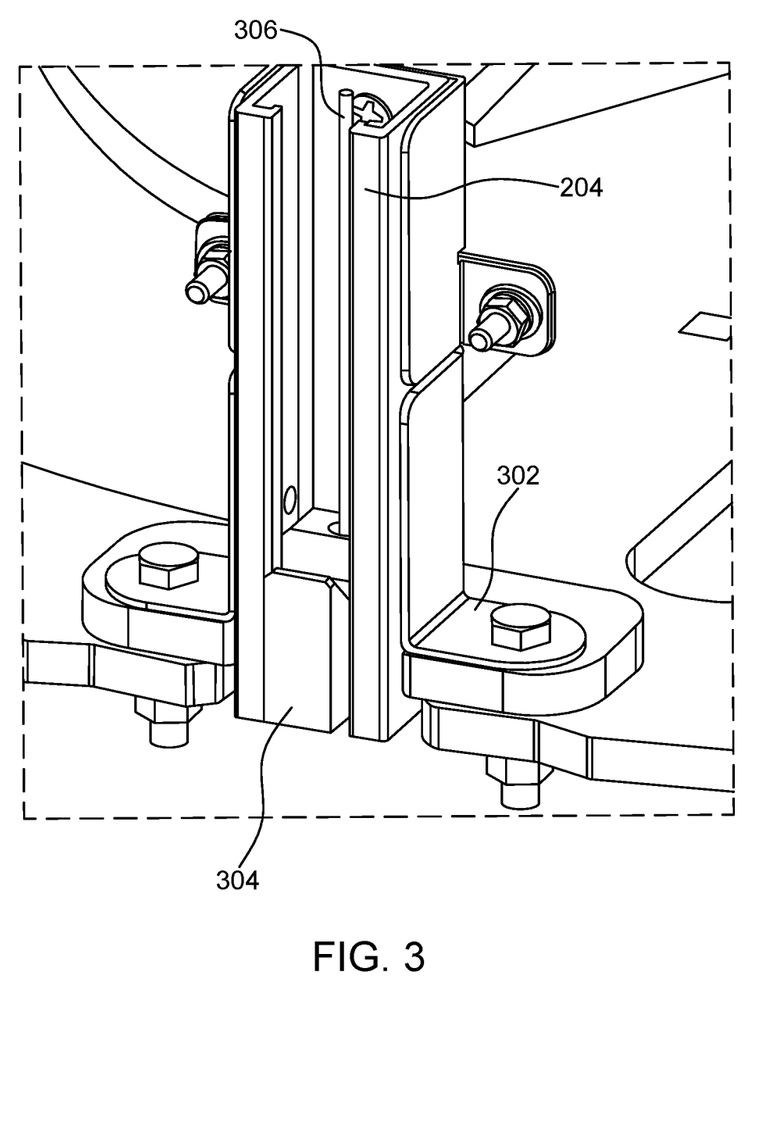
FIG. 3 depicts a first example detailed view of a part of the shroud assembly in accordance with the present disclosure.

The alignment channel(s) 204 of the shroud assembly may be disposed at a periphery of the support structure 202. The alignment channels 204 may be vertical channels that may be connected between the support structure 202a and the support structure 202b. In some aspects, the length of the alignment channels 204 may be equivalent to the length of the equipment 206. In some aspects, each alignment channel 204 may contact the support structures 202a, 202b, and 202c. The alignment channel 204 may be a U-shaped channel (i.e., may have a U-shaped cross-section) that may facilitate the shroud 104 to move/slide vertically via the alignment channels 204. The alignment channels 204 may include an open end that may face opposite/away from the equipment 206 (i.e., away from the shroud 104). A detailed view of an alignment channel is shown in FIG. 3. In an exemplary embodiment, the shroud assembly may include three alignment channels which may be disposed at an equal distance from adjacent alignment channels. In other aspects, the shroud assembly may include more or less number of alignment channels. In some aspects, the alignment channels 204 may be made of any material such as non-metallic material, and may be disposed around a shroud perimeter, and works in conjunction with counterweight (e.g., counterweight 602).

In some aspects, the support structure 202 may include an opening/recess that may be configured to engage with/hold the alignment channels 204. Each alignment channel 204 may be connected to the support structure 202 via a float plate 302. For example, each alignment channel may be bolted to the support structure 202 via one or more bolts to provide stability to the shroud assembly. The float plates 302 may be used to minimize frictional drag and binding of the shroud walls and the alignment channel 204 due to the manufacturing of the support structure 202 and shroud 104. Float plate 302 may also assist the alignment of the shroud 104 to the inner support structure to eliminate binding during the movement of the shroud 104.

In some aspects, the shroud assembly may further include a slide block 304 that may be disposed inside each alignment channel 204, and may be configured to move/slide up and down vertically. The slide block 304 may be configured to engage/interface with the shroud 104 and move the shroud vertically between the first position and the second position. In some aspects, the slide block 304 may be partially disposed inside the alignment channel 204. In other aspects, the slide block 304 may be completely disposed inside the alignment channel 204.

Figure 4:
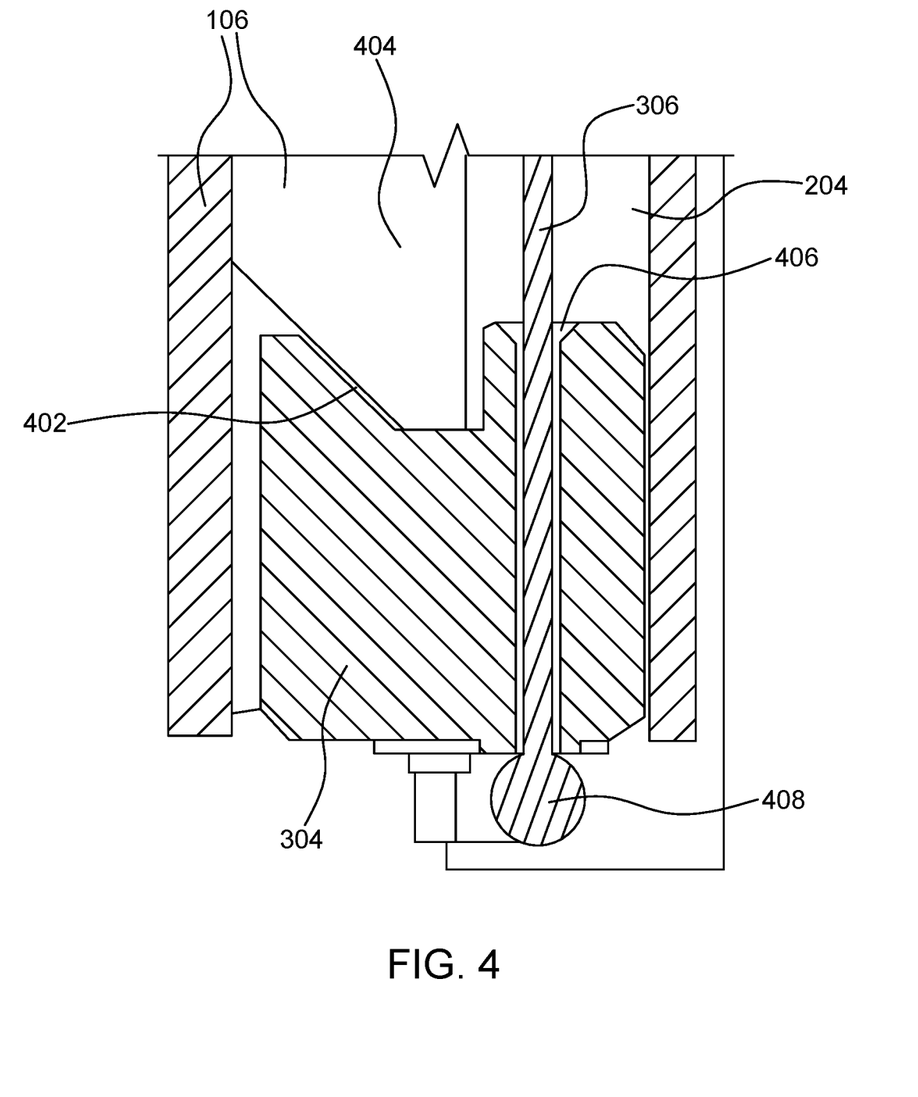
FIG. 4 depicts a second example detailed view of a part of the shroud assembly in accordance with the present disclosure.

In some aspects, the slide block 304 may be a rectangular block that may include a cavity/recess 402 (as shown in FIG. 4) at a top portion (or a side portion) of the slide block 304. The cavity/recess 402 may be configured to receive the shroud 104. In some aspects, the shroud 104 may include a protrusion 404. The shape of the protrusion 404 may correspond to the shape of the cavity/recess 402. In some aspects, the protrusion 404 and the cavity/recess 402 may form a "French cleat" which enables the shroud 104 to engage with the slide block 304 in a secure manner. In some aspects, the shroud 104 may include a plurality of protrusions that may be disposed at a bottom portion of the shroud 104. The count of protrusions may correspond to the count of the alignment channels 204, and the positions of the protrusions may align with the positions of the alignment channels 204. In some aspects, the width of the slide block 304 may be slightly less than the width of the alignment channel 204, so that the slide block 304 may fit inside the alignment channel 204. In some aspects, the length of the slide block 304 may be any percentage (e.g., 1-10%) of the height of the alignment channel 204. In some aspects, the slide block 304 may be made of any material such as low-friction materials, and may have chamfered edges to minimize catching on any joints. This allows the slide block to function without need for lubrication. In another embodiment, if needed, the slide block could be fabricated with different material or a different shape, but lubricant may then be used to enable smooth and easy movement within the alignment channel 204.

Figure 5:
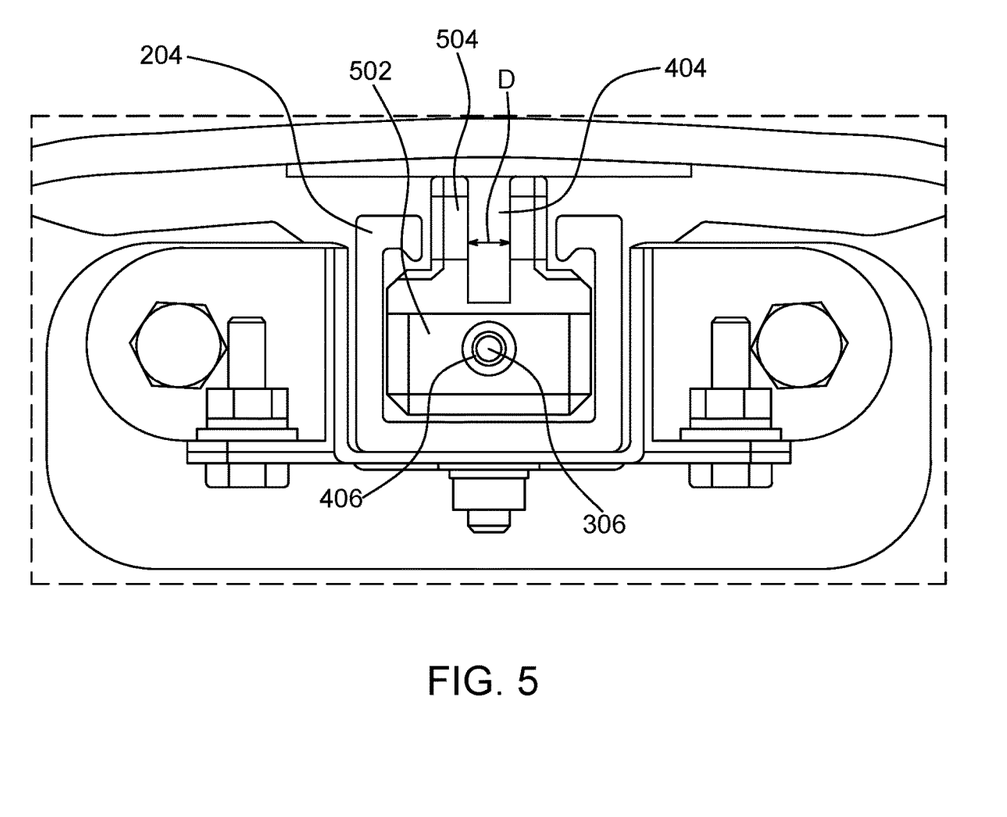
FIG. 5 depicts a top view of a part of the shroud assembly in accordance with the present disclosure.

As shown in FIG. 5, the shroud protrusion 404 fits with in and extends into the opening of strut 204. The slide block rides in the strut and contacts shroud protrusion 404 in a manner shown in FIG. 4. Using the counterweights, cable 306 exerts force on the on slide block which is transferred to the shroud. For the purposes of this invention cable includes ropes, straps, lines, cords, twine, or any other linkage material.

Figure 6:
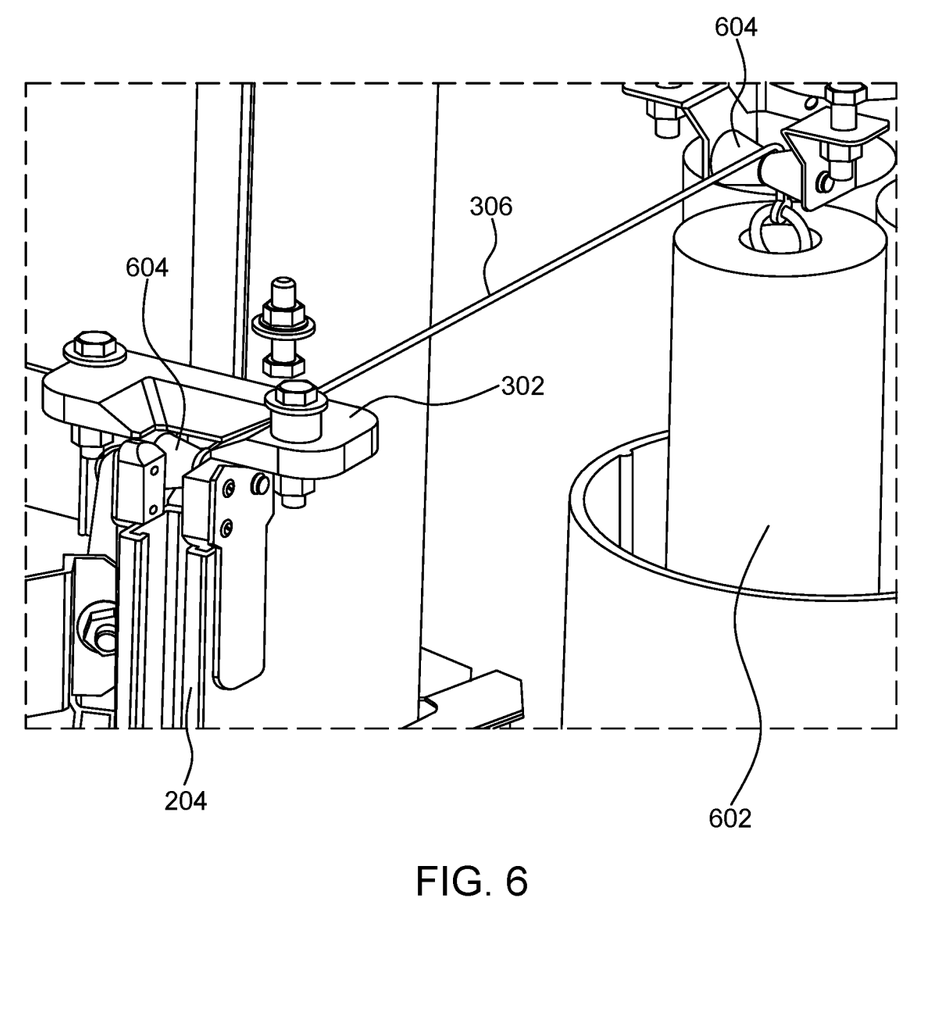
FIG. 6 depicts an example pulling mechanism in accordance with the present disclosure.

The shroud assembly may further include a cable/cord 306 that may be configured to engage the slide block 304 with a counterweight 602 (as shown in FIG. 6). The counterweight 602 may be made of any material (such as steel or lead), which may not interfere with the equipment 206. The cable 306 may also be made from material that has RF transparent properties, such as UV resistant polymers. In some aspects, each alignment channel 204 may have its own counterweight. In some aspects, multiple alignment channels may use a single counterweight, as long as the cord length is properly controlled for uniform engagement of that counterweight from multiple alignment channels.

In an exemplary aspect, the cable 306 may engage the slide block 304 with the counterweight 602 via a pulley 604 (to move the shroud vertically between the first position and the second position). In some aspects, the slide block 304 may include a cavity 406 (or a through-hole) that may allow the cable 306 to pass through. One end of the cable 306 may be connected to the slide block 304 and the other end may be connected to the counterweight 602, via the pulley 604, as shown in FIG. 6. In some aspects, the cable 306 may include a positive stop 408 that may prevent the cable 306 from disengaging with the slide block 304. The positive stop 408 may be disposed in proximity to a bottom end of the slide block 304. In an exemplary aspect, the diameter of the positive stop 408 may be greater the size of the opening, which prevents the cable 306 from disengaging with the slide block 304. In some aspects, the cable 306 may be positioned inside each of the alignment channel 204, and may be configured to the move the slide block 304 vertically in the alignment channel 204 when the counterweight 602 may be attached to the other end of the cable 306. In some aspects, the mass of the counterweight 602 may be adjusted according to the mass of the shroud 104, to allow it to overcome the mass of the shroud plus frictional force along with the added force from the user moving the shroud 104 up or down.

In the down position, the shroud 104 may be mechanically secured to the support structure 202 via securing components. In some aspects, the securing components may include pins, latches, clamps, or screws. In this embodiment, the user would open the mechanical fastener before lifting the shroud 104.

In some aspects, the shroud 104 may not be mechanically secured to the support structure 202 and is only held in place by the alignment channels 204 and the shroud 104 resting in the slide block 304. In the open position, gravity holds the shroud 104 on the slide block 304. If there is a need to fully remove the shroud 104, it may be done by completely vertically lifting the shroud 104 without removal of any additional hardware. This may be done using lightweight equipment.

In some aspects, the alignment channels 204 may keep the shroud 104 from rotating as the user lifts or lowers the shroud 104. This helps to keep the shroud 104 stable and to prevent any features of the shroud 104, such as handgrips, from interfering with the equipment enclosed by the shroud 104. The alignment channels 204 may also ensure that the slide blocks 304 stay in alignment to keep the counterweight system functioning correctly.

Although the present disclosure describes a shroud for a cellular tower, the scope of the present disclosure is not limited to cellular towers. The shroud may be used with any other equipment, without modifying the scope of the present disclosure. The present disclosure provides an effective and efficient way of protecting and concealing any such infrastructure.

In the above disclosure, reference has been made to the accompanying drawings, which form a part hereof, which illustrate specific implementations in which the present disclosure may be practiced. It is understood that other implementations may be utilized, and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a feature, structure, or characteristic is described in connection with an embodiment, one skilled in the art will recognize such feature, structure, or characteristic in connection with other embodiments whether or not explicitly described.

It should also be understood that the word "example" as used herein is intended to be non-exclusionary and non-limiting in nature. More particularly, the word "example" as used herein indicates one among several examples, and it should be understood that no undue emphasis or preference is being directed to the particular example being described.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating various embodiments and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

That which is claimed is:

1. A shroud assembly comprising:
   a shroud configured to enclose equipment;
   a support structure configured to provide support to the shroud;
   one or more alignment channels disposed at a periphery of the support structure; and
   a slide block configured to slide vertically inside the one or more alignment channels, wherein the slide block is further configured to engage with the shroud, and move the shroud vertically between a first position and a second position.

2. The shroud assembly of claim 1 further comprising a cable configured to engage the slide block with a counter weight.

3. The shroud assembly of claim 2, wherein the cable is disposed inside the one or more alignment channels.

4. The shroud assembly of claim 1, wherein the shroud comprises a protrusion, wherein the slide block comprises a cavity, and wherein the protrusion is configured to engage with the cavity to engage the shroud with the slide block.

5. The shroud assembly of claim 1, wherein the shroud is a one-piece shroud.

6. The shroud assembly of claim 1, wherein the shroud comprises a hollow cylindrical body.

7. The shroud assembly of claim 1 further comprising a float plate configured to connect the one or more alignment channels with the support structure.

8. The shroud assembly of claim 1, wherein the support structure comprises one or more circular plates.

9. The shroud assembly of claim 1, wherein the equipment is a cellular tower.

10. The shroud assembly of claim 1, wherein the shroud is configured to enclose the support structure and the one or more alignment channels.

11. A shroud assembly comprising:
    a shroud configured to enclose an equipment;
    a support structure configured to provide support to the shroud;
    one or more alignment channels disposed at a periphery of the support structure; and a slide block configured to slide vertically inside the one or more alignment channels, wherein the slide block is further configured to engage with the shroud, and move the shroud vertically between a first position and a second position, wherein the shroud comprises a protrusion and the slide block comprises a cavity, and wherein the protrusion is configured to engage with the cavity to engage the shroud with the slide block.

12. The shroud assembly of claim 11 further comprising a cable configured to engage the slide block with a counter weight.

13. The shroud assembly of claim 12, wherein the cable is disposed inside the one or more alignment channels.

14. The shroud assembly of claim 11, wherein the shroud is a one piece shroud.

15. The shroud assembly of claim 11, wherein the shroud comprises a hollow cylindrical body.

16. The shroud assembly of claim 11 further comprising a float plate configured to connect the one or more alignment channels with the support structure.

17. The shroud assembly of claim 11, wherein the support structure comprises one or more circular plates.

18. The shroud assembly of claim 11, wherein the equipment is a cellular tower.

19. The shroud assembly of claim 11, wherein the shroud is configured to enclose the support structure and the one or more alignment channels.

20. A shroud assembly comprising:
a shroud configured to enclose equipment;
a support structure configured to provide support to the shroud;
one or more alignment channels disposed at a periphery of the support structure;
a slide block configured to slide vertically inside the one or more alignment channels, wherein the slide block is further configured to engage with the shroud, and move the shroud vertically between a first position and a second position; and
a cable disposed inside the one or more alignment channels, wherein the cable is configured to engage the slide block with a counter weight to move the shroud vertically between the first position and the second position.

* * * * *